(12) United States Patent  
Spiegler et al.

(10) Patent No.: US 10,020,294 B2  
(45) Date of Patent: Jul. 10, 2018

(54) DEVICE WITH LIGHT EMITTING DIODES

(71) Applicant: Melexis Technologies NV, Tessenderlo (BE)

(72) Inventors: Sebastian Spiegler, Erfurt (DE); Thomas Freitag, Plaue (DE); Michael Bender, Erfurt (DE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/810,827

(22) Filed: Nov. 13, 2017

(65) Prior Publication Data

US 2018/0138161 A1     May 17, 2018

(30) Foreign Application Priority Data

Nov. 16, 2016 (EP) ..................................... 16199150

(51) Int. Cl.
*H05B 33/00* (2006.01)
*H01L 25/16* (2006.01)
(Continued)

(52) U.S. Cl.
CPC ....... *H01L 25/167* (2013.01); *H05B 33/0851* (2013.01); *H05B 33/0869* (2013.01); *H05B 37/0254* (2013.01); *H01L 25/0753* (2013.01); *H01L 27/1446* (2013.01); *H01L 31/02162* (2013.01); *H01L 33/60* (2013.01)

(58) Field of Classification Search
CPC ......... H01L 2924/0002; H01L 2924/00; H01L 2924/1433; H01L 2924/19041; H01L 2924/19042; H01L 2924/19043; H01L 27/14692; H01L 2924/30105; H01L 27/14687; H01L 27/14683; H01L 2224/18; H01L 27/14609
See application file for complete search history.

(56) References Cited

U.S. PATENT DOCUMENTS 6,069,676 A    5/2000   Yuyama
7,598,681 B2   10/2009   Lys et al.
(Continued)

FOREIGN PATENT DOCUMENTS

DE     102012217932 A1    4/2014
EP        2854483 A1     4/2015
(Continued)

OTHER PUBLICATIONS

European Search Report from EP Application No. EP 16199150.0, dated Mar. 24, 2017.

*Primary Examiner* — Monica C King
(74) *Attorney, Agent, or Firm* — Workman Nydegger

(57) ABSTRACT

A multi-LED device comprises a transparent substrate, a plurality of light emitting diodes, LEDs, arranged for emitting light of a plurality of colors and disposed on the transparent substrate, an integrated control circuit in connection with the LEDs and comprising a plurality of photo sensors optically connected to the LEDs. Each photo sensor is provided with a color filter. The integrated circuit is arranged for receiving via the plurality of photo sensors information on a light intensity of the plurality of colors of the LEDs and for regulating the light intensity of the colors of the LEDs based on the information on the light intensity. The transparent substrate with the plurality of LEDs is flip-chip mounted on the integrated control circuit.

10 Claims, 4 Drawing Sheets

(51) Int. Cl.
*H05B 33/08* (2006.01)
*H05B 37/02* (2006.01)
*H01L 33/60* (2010.01)
*H01L 27/144* (2006.01)
*H01L 25/075* (2006.01)
*H01L 31/0216* (2014.01)

(56) References Cited

U.S. PATENT DOCUMENTS

| | | |
|---|---|---|
| 2004/0145301 A1 | 7/2004 | Yoshida |
| 2011/0068697 A1 | 3/2011 | Hum |
| 2012/0074432 A1 | 3/2012 | Chou |
| 2015/0382426 A1 | 12/2015 | Odnoblyudov et al. |
| 2016/0016399 A1 | 1/2016 | Bower et al. |

FOREIGN PATENT DOCUMENTS

| | | |
|---|---|---|
| JP | H1049074 A | 2/1998 |
| WO | 2004100265 A2 | 11/2004 |
| WO | 2007083250 A1 | 7/2007 |
| WO | 2008025625 A1 | 3/2008 |

DEVICE WITH LIGHT EMITTING DIODES

FIELD OF THE INVENTION

The present invention is generally related to the field of light emitting devices. More in particular it relates to light emitting devices for use in automotive applications.

BACKGROUND OF THE INVENTION

Ambient lighting in automotive applications is nowadays achieved by providing one or more-colour-light emitting diodes (LEDs) located in various positions in the car. Each of the LEDs is individually controlled in intensity and colour by an integrated circuit (IC) via a communication interface. The LEDs must be calibrated by means of the IC before use to a given target value. A diagnosis of the connected one or more colour LED must be performed during operation.

In today's applications the ambient lighting functionality is assembled on a single Printed Circuit Board (PCB), which requires a certain amount of space. For some applications it requires too big a space, especially if LEDs (and their controlling units) are very close to one another. Hence, there is a constant need to reduce the space occupied by the one or more colour-light emitting diodes significantly by further integration.

It is known that LEDs as a light source produce a significant heat. In classic approaches a heat sink and a good thermal contact are applied to these applications. It is obvious, that a certain space for the heat sink is needed. This might be challenging in case of space limitations. Material like copper or aluminium for the heat sink is needed. Another way to solve the heat problem is the use of LEDs in a bigger matrix. The LEDs are usually put in a big matrix configuration over a given area, so that heat is not generated on a single point for the full power, but distributed over the area. This leads to a lower junction temperature of the LEDs and a longer life time. The use of so called micro-LEDs, i.e. very small LEDs, has been suggested for that purpose. Space saving has also been a motivation to apply semiconductor technology for interconnecting the LEDs, as bonding the micro-LEDs would take too much space.

The controlling of LEDs is for example described in application EP2854483, which discloses an illumination device comprising a plurality of LEDs of various colours and drivers. The device comprises a number of switches/regulators interconnected in a circuit. The switches are part of a driver. An associated controller takes care of aperiodically and independently opening and closing the switch or regulator. The controller generates a variety of PWM signals, each corresponding to a respective colour of the plurality of LEDs of different colours.

In U.S. Pat. No. 7,598,681 B2 is disclosed an integrated circuit to control at least one illumination source. The integrated circuit includes a clock generating circuit coupled to a data reception circuit for extracting information from serial data input to the integrated circuit in coordination with a clock pulse generated by the clock generating circuit. An illumination control signal generation circuit generates at least one illumination control signal to control the at least one illumination source based on the extracted information.

Hence, there is a need for a LED device which meets the limited space requirements and allows controlling the LEDs of the device.

SUMMARY OF THE INVENTION

It is an object of embodiments of the present invention to provide for a compact LED device capable of analysing and regulating at least the light intensity of the LEDs.

The above objective is accomplished by the solution according to the present invention.

In a first aspect the invention relates to a multi-LED device comprising
- a transparent substrate,
- a plurality of light emitting diodes, LEDs, arranged for emitting light of a plurality of colours and disposed on said transparent substrate,
- an integrated control circuit in connection with said LEDs and comprising a plurality of photo sensors optically connected to said LEDs, each photo sensor being provided with a colour filter, said integrated circuit arranged for receiving via said plurality of photo sensors information on a light intensity of said plurality of colours of said LEDs and for regulating said light intensity of said colours of said LEDs based on said information on the light intensity, whereby the transparent substrate with said plurality of LEDs are flip-chip mounted on the integrated control circuit.

The proposed solution indeed allows for creating a closed loop to regulate the light intensity of the LEDs. The integrated control circuit is provided with information on the intensity of the light captured by the photo sensors and based thereon the control circuit adapts the current in the LEDs to regulate the light intensity. The obtained information can also be used for diagnostic purposes. A further important asset of the proposed circuit is its compactness. This is obtained among other things by bringing the LEDs and the integrated circuit in a single package and by mounting the colour filters on top of the photo sensors in the integrated circuit.

In preferred embodiments the first plurality of LEDs is disposed on the substrate in parallel between a first and a second interconnection.

In preferred embodiments the integrated control circuit is mounted on the substrate.

In embodiments the integrated control circuit comprises a temperature sensing unit. In another embodiment the integrated control circuit comprises at least one current sensing unit. In yet other embodiments the integrated control circuit comprises at least one voltage sensing unit. In yet further embodiments the integrated control circuit comprises a communication interface. The communication interface is advantageously a Local Interconnect Network (LIN) bus interface. Obviously these embodiments can be combined.

In an advantageous embodiment the integrated control circuit comprises data storage means.

As LEDs with more than one colour are used, the multi-LED device comprises at least one colour filter.

In one embodiment the multi-LED device comprises a light releasing tab between adjacent LEDs.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
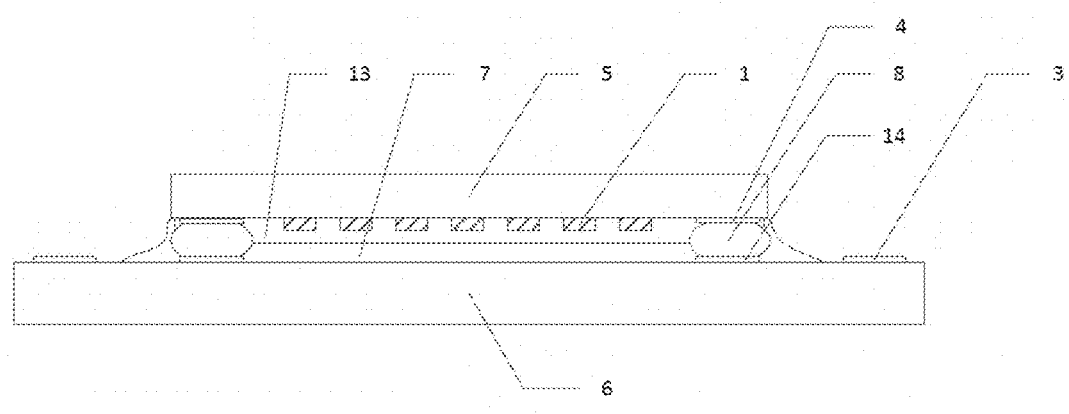
FIG. 1 illustrates an embodiment of a multi-LED device according to the invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes a compact LED device comprising an integrated control circuit capable of regulating at least the light intensity of one of the colours emitted by the LEDs by means of a closed loop using optical feedback.

FIG. 1 shows an embodiment of a multi-LED device according to the invention. A plurality of LEDs (1) is mounted on a substrate (5), e.g. a transparent substrate like glass. The LEDs can have a single colour or can have different colours. If for instance three colours are used, each colour may be put in a different light channel, so that three light channels are derived in that case. Via connection pads (4) and solder joints (8) the LEDs are connected to a controlling IC (6). This can be achieved e.g. with metallisation process steps, photolithographic structuring and insulation layer deposition, e.g. silicon oxide.

In one embodiment the LEDs are micro-LEDs, which means that the LEDs have very small outline dimensions. Micro-LEDs can have a size in the range of 5 to 500 µm, preferably in the range of 10 to 100 µm.

In one embodiment the LEDs can be mounted on the substrate using a transfer printing technology as described for instance in US2016/016399 A1.

In one embodiment the LEDs as well as the metal interconnections are covered by a protection layer (13), e.g. silicon oxide or polyimid. As illustrated in FIG. 1, a non-conducting and transparent glue (7) can be used between the protective layer and the controlling IC (6).

On the connection pads (4) solder joints (8) are placed. The transparent substrate (5) and the LEDs interconnected in a matrix configuration are mounted by means of e.g. a flip chip approach or other, similar technologies, to the controlling IC (6) via connection pads (14) on the controlling IC.

The controlling IC has bond pads (3) that are connected using a classic bonding technology towards a lead frame construction (not shown here) depending on the overall package construction used. A classic bonding with wires is possible, whereby the package has the light opening on top.

Alternatively, it can also be a flip chip bonding, if the light opening is on the bottom (in relation to the used lead frame).

Interconnections between the LEDs and the controlling IC can be achieved with bonding technologies or with an additional metallization layer, which is structured by performing some structuring processing steps in order to form the interconnections.

Figure 2:
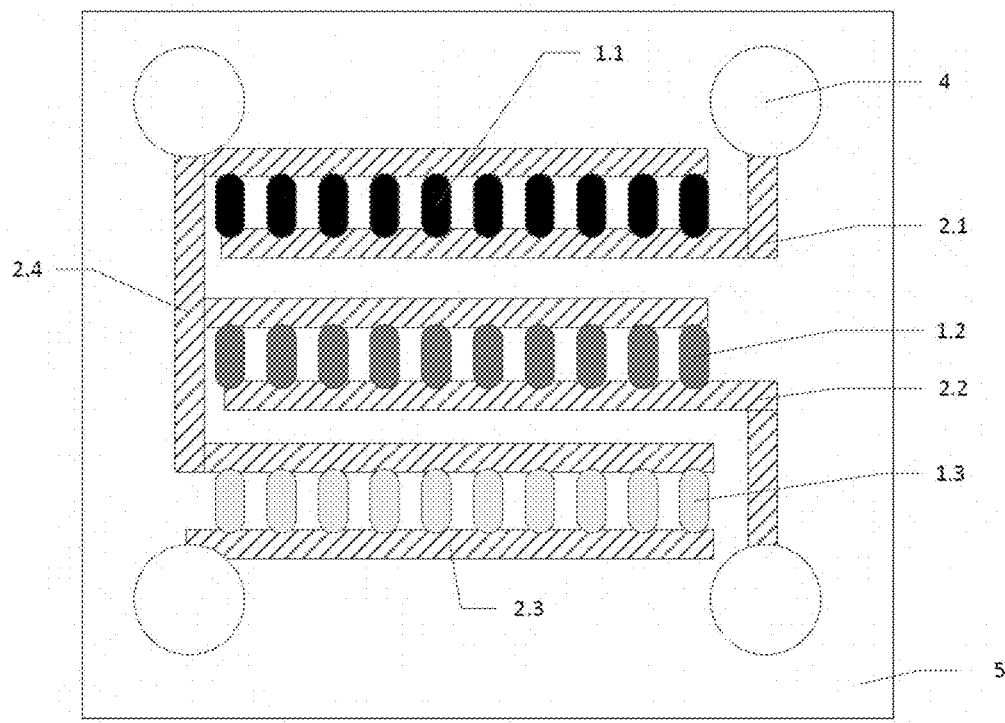
FIG. 2 illustrates the connection of the LEDs using one interconnection layer.

FIG. 2 shows a plurality of LEDs (micro-LEDs or other LEDs) that can provide light of a single colour or of different colours (1.1, 1.2, 1.3). The LEDs are arranged in stripes with the same colour. The interconnections of the LEDs to the connection pads (2.1, 2.2, 2.3, 2.4) are shown as well. Only one metallization layer is needed. There are three different light channels.

Figure 3:
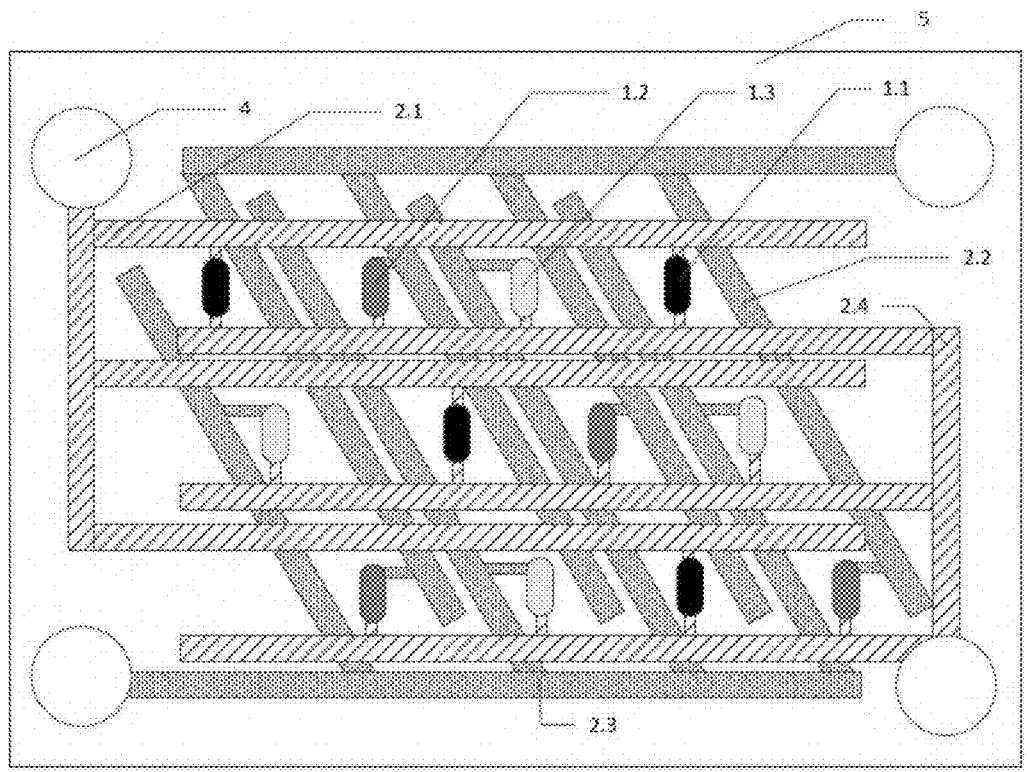
FIG. 3 illustrates the connection of LEDs using two interconnection layers, so that other LEDs arrangements are possible.

FIG. 3 illustrates an embodiment wherein a plurality of LEDs (micro-LEDs or other LEDs) is used that can provide light of different colours (1.1, 1.2, 1.3). The LEDs are arranged in a matrix configuration of the different colours, so that a better colour mixing can be achieved. The interconnections of the LEDs to the connection pads (2.1, 2.2, 2.3, 2.4) are shown as well. This configuration requires two or more interconnection layers and insulation layers between, which has an impact on cost.

Figure 4:
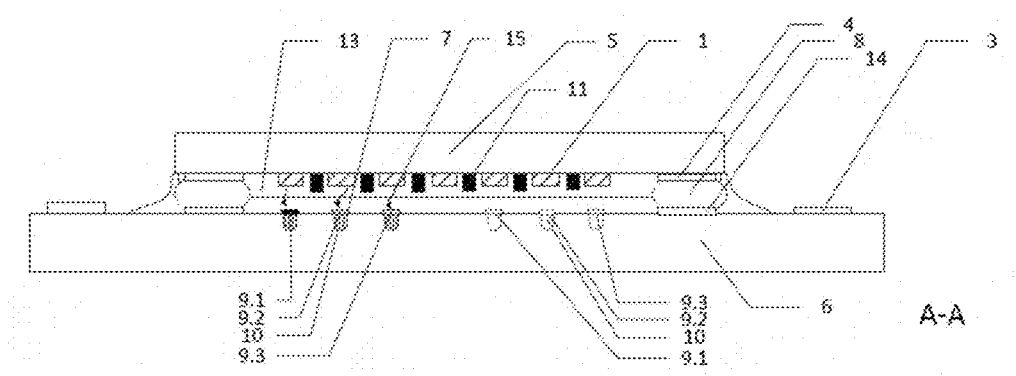
FIG. 4 illustrates an embodiment of a multi LED device according to the invention in side view.

The controlling IC has on chip light receivers (photo sensors 10), e.g. photodiodes, in one embodiment. This is shown in FIG. 4.

In another embodiment the photo sensors are external to the IC, but still have a very closed optical link to the light emitters. For instance, they can be assembled on the substrate (5) of the micro-LEDs, so that a closed optical link (15) is ensured.

On top of the photo sensors, thus on the surface of the controlling IC, colour filters (9.1, 9.2, 9.3) can be assembled, e.g. using a microtransfer printing technology. This enables the photo sensors to measure the light intensity for a given colour or light channel in a spectral way.

On the transparent substrate light releasing tabs (11), which act as an optical shielding or optical filter between the micro-LEDs and thus enable a directed light traveling towards the light receivers, might be assembled with a micro transfer printing technology as well. These light releasing tabs can be non-transparent or they can have a selective optical transparency. They can be made for instance out of glass or a polymer. The photo sensors together with the light releasing tabs have a closed optical link (15) to the light emitters.

Figure 5:
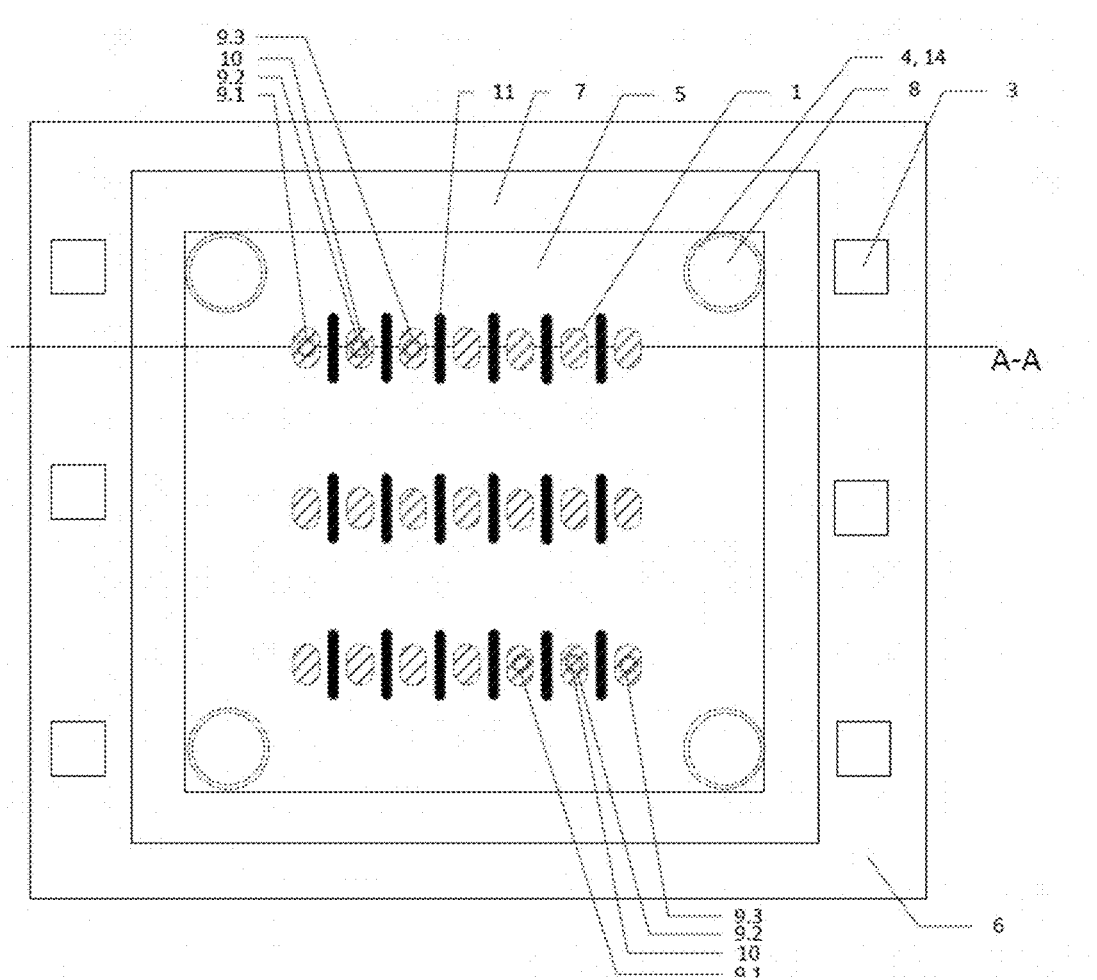
FIG. 5 illustrates an embodiment of a multi LED device according to the invention in top view.

FIG. 5 shows the top view of FIG. 4. The photo sensors (10) together with the colour filters (9.1, 9.2, 9.3) can be placed anywhere in relation to the light sources of the light emitting device. Three photo sensors with three colour filters (for the three colours of the light emitting device) can be used. It is possible in certain embodiments to have more photo sensors and more colour filters. In other embodiments there might be only one photo sensor or two photo sensors with or without colour filters. The light releasing tabs (11) can be placed between all LEDs (1) as in the embodiment shown in FIG. 5 or only on the LEDs that are arranged in a closed optical link (15).

The controlling IC can then use the information of the light receivers for a closed loop regulation. Based on the information on the light intensity received via the photo sensor(s) the current through the LEDs can be adapted, e.g. by means of a controllable current source. In another embodiment the current source is switched on and off by means of a pulse width modulation (PWM), wherein the ratio between on/off is also a regulation means of the current through the LEDs. Alternatively, the light intensity regulation can be performed by adapting the voltage that is provided to the LEDs by means of a controllable voltage regulator. If the voltage is adjusted, then the current is adjusted accordingly, following the I=f(V) characteristics of the LEDs. It can be understood that these methods can also be combined.

Figure 6:
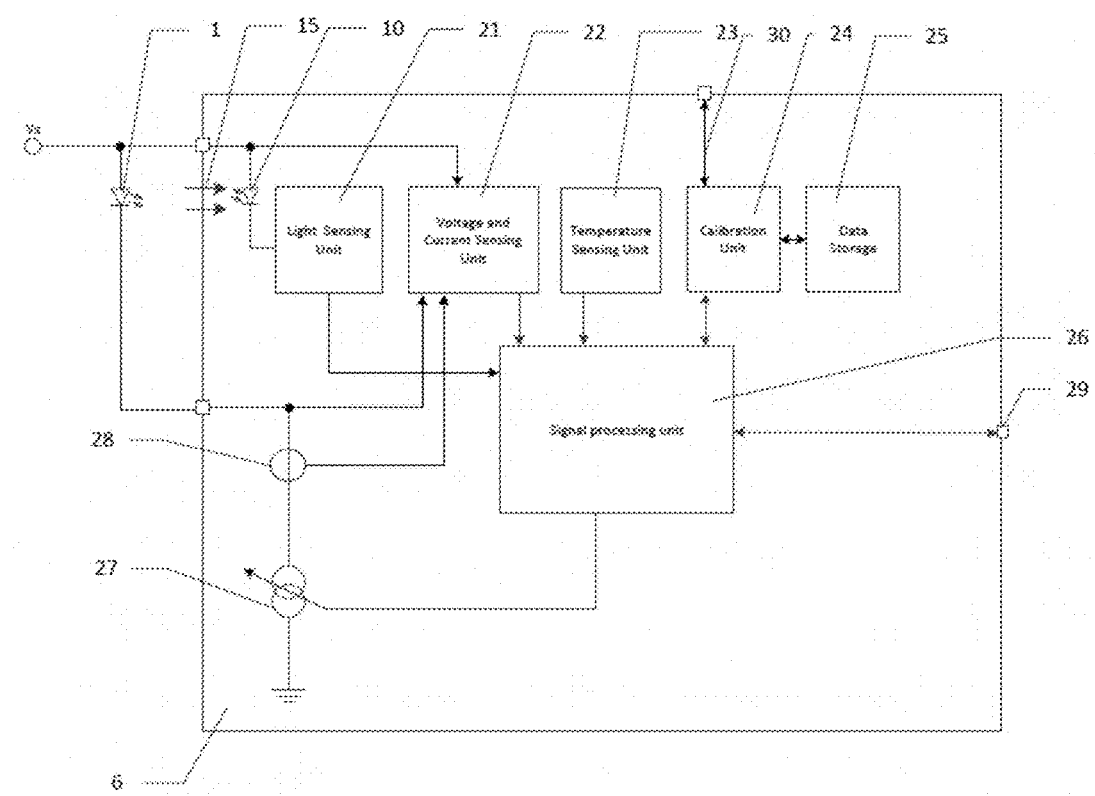
FIG. 6 illustrates an implementation of the controlling integrated circuit (IC) according an embodiment of the multi LED device.

FIG. 6 shows an advantageous embodiment of the controlling IC (6). It contains a light sensing unit (21) e.g. with an amplifier, a filter and an ADC channel, which transforms the output of the photo sensors to another voltage domain and provides this information per light channel (colour) to an ADC in the signal processing unit (26). For practical reasons only one channel for the light measurement as well as only one channel for the light output is shown in the figure. If more light channels are used, the number of photo sensors, light sensing units, current sources (27) and current sensors (28) increases accordingly. If the photo sensors in the closed optical links are outside the controlling IC, their sensing information is received via a pin of the IC.

In the embodiment shown in FIG. 6 there is a voltage and current sensing unit (22) with multiplexer, amplifier, filter and ADC to measure the supply voltage, the voltages supplied on and the currents through the light emitters per light channel (colour). This information is fed to the signal processing unit. The currents through the light channels can be measured via current sensors (28) like for instance shunt resistors. It is to be noted that this is just one possible embodiment and that many alternatives are available. For example, it may be that the current of the LED is not measured or that the voltage on the LED is not measured. In another embodiment the supply voltage may not be measured. In another embodiment nor current nor voltages are measured. As the light intensity information is present in the feedback loop, the current through the light emitters is just increased or decreased in a way already described previously, until the preferred light intensity is achieved. It is therefore understandable that the current through the light emitters nor the applied voltage must be known as absolute value, thus a measurement is not needed for the regulation loop itself.

In all the embodiments the output of the light sensing unit is used to regulate preferably the current of the current source (27) and thus the light intensity for the given light channel. Alternatively the light intensity is regulated by adapting the voltage rather than the current.

A temperature sensing unit (23) contains a temperature sensor, e.g. a diode or a resistor (not shown), and provides information on the junction temperature of the controlling IC via an ADC-Channel to the ADC of the signal processing unit. As the light module is quite compact, the temperature coupling between the controlling IC and the light emitters is quite well, so that the temperature information of the temperature sensing unit gives an indication of the overall temperature in the module what can be used later on for light regulation purposes.

In another embodiment the temperature sensor is external to the controlling IC and mounted directly in the assembly of the light receivers. The temperature sensor output is then provided to the temperature sensing unit via a pin of the controlling IC or a combination of both.

In one embodiment a calibration unit (24) has via a serial interface (30) an access possibility to the signal processing unit and offers the possibility to store calibration data into a data storage (25). The communication interface (29) can either be unidirectional (i.e. towards the controlling IC (6)) or bidirectional (as illustrated in FIG. 6). In an advantageous embodiment the communication interface is a Local Interconnect Network (LIN) bus interface.

If the communication interface is unidirectional, the controlling IC receives via this channel the target value for the light intensity per light emitting channel for the regulation loop.

If the communication interface is bidirectional, as is for instance the case in a LIN-Bus, the controlling IC also receives the light intensity per light emitting channel. However, it also provides diagnostic data to a higher level system. In simple cases this can be alarm information, indicating one or more light emitting channels are broken. In more advanced cases the current through the LEDs or the voltage across the LEDs are measured and compared towards the measured light intensity. Out of this comparison, information about the aging of the LEDs might be built up, which may also be conveyed via the bidirectional communication interface to a higher level system.

In another embodiment the serial interface (30) and the communication interface (29) can be combined into a single interface.

The signal processing unit controls different current sources (27) for each light channel (colour) of the light emitters either in an analog way or in a way controlled by a pulse width modulator (PWM), for instance as previously described.

During an "end of line calibration step" all inputs of the signal processing unit are read out via the calibration unit and its serial interface (30). Possible errors as e.g. offset of voltage, current and temperature measurements are stored in the data storage. These errors can also be used in the light regulation. The light emitters are driven to different light intensities per light channel (colour) and are measured back via the photo sensors. A calibration table between the light intensities per light channel (colour) and the received light information is built up, which may be later be used in a light intensity regulation loop. The table is stored in the data storage.

At nominal operation the signal processing unit (26) controls the current sources (27) in an analog manner or by means of a PWM in order to achieve a given light intensity per light channel (colour). The received target light intensity per colour is available for use via a bidirectional communication interface (29) (for instance, in an advantageous embodiment a LIN bus) thereby exploiting the inputs of the signal processing unit as well as the calibration data out of the data storage (25).

From the measurements and the available calibration data diagnostic information of the light emitting device can be derived, which might be provided via the communication interface (29) of the signal processing unit (26) to the external world.

The proposed solution can advantageously applied in applications in the field of automotive ambient lighting with space constraints.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A multi-LED device comprising
a transparent substrate,
a plurality of light emitting diodes, LEDs, arranged for emitting light of a plurality of colours and disposed on said transparent substrate,
an integrated control circuit in connection with said LEDs and comprising a plurality of photo sensors optically connected to said LEDs, each photo sensor being provided with a colour filter, said integrated circuit arranged for receiving via said plurality of photo sensors information on a light intensity of said plurality of colours of said LEDs and for regulating said light intensity of said colours of said LEDs based on said information on the light intensity,
wherein said transparent substrate with said plurality of LEDs is flip-chip mounted on said integrated control circuit.

2. The multi-LED device as in claim 1, wherein said plurality of LEDS is disposed on said substrate in parallel between a first and a second interconnection.

3. The multi-LED device as in claim 1, wherein said integrated control circuit is mounted on said substrate.

4. The multi-LED device as in claim 1, wherein said integrated control circuit comprises a temperature sensing unit.

5. The multi-LED device as in claim 1, wherein said integrated control circuit comprises at least one current sensing unit.

6. The multi-LED device as in claim 1, wherein said integrated control circuit comprises at least one voltage sensing unit.

7. The multi-LED device as in claim 1, wherein said integrated control circuit comprises a communication interface.

8. The multi-LED device as in claim 7, wherein said communication interface is a Local Interconnect Network, LIN, bus interface.

9. The multi-LED device as in claim 1, wherein said integrated control circuit comprises data storage means.

10. The multi-LED device as in claim 1, comprising a light releasing tab between adjacent LEDs.

* * * * *